(12) United States Patent
Motomura (10) Patent No.: US 9,431,423 B2
(45) Date of Patent: Aug. 30, 2016

(54) SEMICONDUCTOR INTEGRATED CIRCUIT (71) Applicant: Sony Corporation, Tokyo (JP)

(72) Inventor: Tetsuo Motomura, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/818,029

(22) Filed: Aug. 4, 2015

(65) Prior Publication Data

US 2015/0340321 A1 Nov. 26, 2015

Related U.S. Application Data (63) Continuation of application No. 14/705,668, filed on May 6, 2015, which is a continuation of application No. 12/453,498, filed on May 13, 2009, now Pat. No. 9,048,140.

(30) Foreign Application Priority Data

Jun. 12, 2008 (JP) .................................. 2008-154475

(51) Int. Cl.
*H02J 3/14* (2006.01)
*H01L 27/118* (2006.01)
*H01L 27/088* (2006.01)
*G06F 1/32* (2006.01)
(Continued)

(52) U.S. Cl.
CPC ....... *H01L 27/11807* (2013.01); *G06F 1/3287* (2013.01); *H01L 23/5286* (2013.01); *H01L 27/0207* (2013.01); *H01L 27/088* (2013.01); *H03K 19/0016* (2013.01); *H01L 2924/0002* (2013.01); *Y02B 60/1282* (2013.01); *Y10T 307/461* (2015.04)

(58) Field of Classification Search
CPC ..................... H01L 27/11807; H01L 27/0207; H01L 23/5286; H01L 2924/0002; H01L 2924/00; Y02B 60/1278; Y02B 60/1282; G06F 1/3287
USPC .......................................................... 307/38
See application file for complete search history.

(56) References Cited

U.S. PATENT DOCUMENTS 3,835,530 A 9/1974 Kilby
5,315,182 A 5/1994 Sakashita et al.
(Continued)

FOREIGN PATENT DOCUMENTS

| EP | 1 575 091 A2 | 9/2005 |
|----|----|----|
| JP | 2005-259879 | 9/2005 |
| KR | 100 835 436 B1 | 6/2008 |

OTHER PUBLICATIONS

Extended European Search Report issued Jun. 16, 2010 for corresponding European Application No. 09 16 2504.
(Continued)

*Primary Examiner* — Rexford Barnie
*Assistant Examiner* — Toan Vu
(74) *Attorney, Agent, or Firm* — Michael Best and Friedrich LLP (57) ABSTRACT

Disclosed herein is a semiconductor integrated circuit including: a cell layout region including circuit cells subject to power control the supply and interruption of power to which is controlled by a power switch, and always-on circuit cell groups which are always powered after the activation; a main line laid out in the cell layout region and applied with a source or reference voltage; and first and second branch lines which branch from the main line in the cell layout region.

9 Claims, 2 Drawing Sheets (51) Int. Cl.
  *H01L 23/528* (2006.01)
  *H01L 27/02* (2006.01)
  *H03K 19/00* (2006.01)

(56) References Cited

U.S. PATENT DOCUMENTS

| | | |
|---|---|---|
| 5,528,542 A | 6/1996 | Okamura |
| 5,539,223 A | 7/1996 | Sugoh et al. |
| 6,107,869 A | 8/2000 | Horiguchi et al. |
| 7,411,267 B2 | 8/2008 | Yamawaki et al. |
| 7,768,768 B2 | 8/2010 | Sakurabayashi |
| 8,643,178 B2 | 2/2014 | Lee |
| 2004/0051574 A1 | 3/2004 | Ko et al. |
| 2005/0138588 A1 | 6/2005 | Frenkil |
| 2005/0200383 A1* | 9/2005 | Ogata ................. H01L 27/0203 326/41 |
| 2006/0011952 A1 | 1/2006 | Ohkawa |

OTHER PUBLICATIONS

Won, Hyo-Sig et al., "An MTCMOS Design Methodologyand its Application to Mobile Computing" Proceedings of the 2003 International Symposium on Low Power Electronics and Design. ISLPED'03, Seoul, Korea, Aug. 25-27, 2003; New York, NY ACM, US, Aug. 25, 2003, pp. 110-115, XP010658597, ISBN 978-1-58113-682-1, chapters 2.2.1 to 2.2.3. pp. 111-113.

Kosonocky et al., "Enhanced Multi-Threshold (MTCMOS) Circuits Using Variable Well Bias", IBM T.J. Watson Research Center/IBM Microelectronics, ISLPED'01, Aug. 6-7, 2001, pp. 165-169.

\* cited by examiner

SEMICONDUCTOR INTEGRATED CIRCUIT

CROSS REFERENCE TO RELATED APPLICATIONS

This application is a Continuation Application of application Ser. No. 14/705,668, filed May 6, 2015, which is a Continuation Application of application Ser. No. 12/453,498, filed May 13, 2009, which claims priority to Japanese Priority Patent Application JP 2008-154475, filed in the Japan Patent Office on Jun. 12, 2008, the entire contents of which are hereby incorporated by reference.

BACKGROUND OF THE INVENTION

1. Field of the Invention

Embodiments of the present invention relate to a semiconductor integrated circuit having a so-called MTCMOS (multi-threshold complementary metal oxide semiconductor)-based and non-MTCMOS-based circuit cells in a mixed manner in the same circuit block.

2. Description of the Related Art

Controlling the supply and interruption of the source or reference voltage to the circuit cells is known, for example, as a circuit technique called MTCMOS (multi-threshold complementary metal oxide semiconductor). For instance, MTCMOS connects a power switch transistor having a higher threshold voltage than the transistors of the functional circuit to the path adapted to supply the source or reference voltage (e.g., GND voltage) to each of the circuit blocks serving a specific function. When a circuit block is not used, the power switch transistor is turned off, interrupting the leak current to the transistors in the circuit block. This ensures significantly reduced wasteful leak current flowing into the unused circuit block.

A semiconductor integrated circuit has already been proposed in which the power switch transistors in a cell form are laid out as appropriate in the circuit cell layout region. This semiconductor integrated circuit is intended to eliminate the inconvenience of manually laying out the power switch transistors in the design of a semiconductor integrated circuit including MTCMOS-based circuit blocks (refer to Japanese Patent Laid-Open No. 2005-259879, hereinafter referred to as Patent Document 1).

MTCMOS-based and non-MTCMOS-based circuit cells are laid out in a mixed manner in the circuit block described in Patent Document 1.

SUMMARY OF THE INVENTION

The technique described in Patent Document 1 achieves an intended circuit by laying out circuit cells based on a power control technique such as MTCMOS (circuit cells subject to power control) and others not based thereon (always-on circuit cells) in the same circuit block in a mixed manner. At this time, two branch lines must be provided in each circuit cell, i.e., a first branch line whose connection to the source or reference voltage via the power switch is controlled (so-called virtual source or reference voltage line) and a second branch line which is directly connected to the main line applied with the source or reference voltage without the power switch.

In the layout of these circuit cells, it is still not known, at the design stage of the circuit cells, what kind of function the circuit block has for which the circuit cells will be used. At the time of design of the circuit cells, therefore, the first and second branch lines in the circuit cell must be sufficiently reduced in wiring resistance in consideration of possible IR drop (voltage drop as a result of current flow) and electromigration resistance to ensure versatility.

In particular, the second branch line which is directly connected to the main line without the power switch adversely affects the nearby circuit cells in operation by causing an IR drop and delaying the operation of these cells. In a versatile circuit cell with no limitations in its location in the circuit block, therefore, a sufficiently thick wiring must be used on the pattern for the branch lines and particularly for the second branch line. Depending on the locations thereof in the circuit block, however, some lines are excessively thick. This has led to a uselessly large circuit cell size.

It is desirable to provide a semiconductor integrated circuit which can suppress uselessly thick wirings for the first and second branch lines in the circuit cells so as to permit reduction in cell area and provide high efficiency in the layout of cells in the circuit block.

A semiconductor integrated circuit according to an embodiment (first embodiment) of the present invention includes a cell layout region, main line, and first and second branch lines. The cell layout region includes circuit cells subject to power control and always-on circuit cell groups which are always powered after the activation. The supply and interruption of power to the circuit cells subject to power control is controlled by a power switch. The main line is laid out in the cell layout region and applied with a source or reference voltage. The first and second branch lines branch from the main line in the cell layout region. The circuit cells subject to power control are connected to the main line via the power switch and first branch line. The always-on circuit cell groups include a plurality of branch connection circuit cells and an individual connection circuit cell. The plurality of branch connection circuit cells are connected to the main line via the common second branch line and always powered after the activation. The individual connection circuit cell is connected to the main line via an individual connection line without the second branch line and always powered after the activation.

In a semiconductor integrated circuit according to another embodiment (second embodiment) of the present invention, the main line and second branch line are disposed orthogonal to each other in the first embodiment. The individual connection circuit cell is laid out in a main-line-adjacent region which is a region within a predetermined distance from the main line in the cell layout region. The plurality of branch connection circuit cells are laid out in the cell layout region other than the main-line-adjacent region.

In a semiconductor integrated circuit according to still another embodiment (third embodiment) of the present invention, the main line and second branch line are disposed orthogonal to each other in the first embodiment. The individual connection circuit cell is laid out adjacent to the main line without any of the circuit cells subject to power control provided therebetween. Other circuit cells are laid out between each of the plurality of branch connection circuit cells and the main line.

In a semiconductor integrated circuit according to still another embodiment (fourth embodiment) of the present invention, the individual connection circuit cell has a source current driving capability equal to or higher than a predetermined level in the first embodiment. The plurality of branch connection circuit cells each have a source current driving capability lower than the predetermined level.

In a semiconductor integrated circuit according to still another embodiment (fifth embodiment) of the present invention, a maximum source current equal to or higher than a predetermined level flows through the individual connection circuit during operation in the first embodiment. A maximum source current smaller than the predetermined level flows through each of the plurality of branch connection circuit cells during operation.

In a semiconductor integrated circuit according to still another embodiment (sixth embodiment) of the present invention, the individual connection circuit has a total transistor gate width equal to or greater than a predetermined width in the first embodiment. The plurality of branch connection circuit cells each have the total transistor gate width smaller than the predetermined level.

In the present invention, the plurality of branch connection circuit cells, i.e., the always-on circuit cell groups, may include at least either a so-called unknown propagation prevention circuit cell or retention register circuit cell.

According to the first embodiment, the always-on circuit cell groups which are always powered after the activation include the plurality of branch connection circuit cells and the individual connection circuit cell. The plurality of branch connection circuit cells are connected to the main line via the common second branch line. However, the individual connection circuit cell is connected to the main line via an individual connection line without the second branch line.

When the semiconductor integrated circuit is activated, a source current flows from the plurality of branch connection circuit cells to the main line via the second branch line or from the main line to the plurality of branch connection circuit cells via the second branch line. In contrast, the individual connection circuit cell is not connected to the second branch line. Therefore, a source current flows to the main line via an individual connection line. As a result, the source current flowing through the individual connection circuit cell does not flow through the second branch line.

Particularly when the individual connection circuit cell is laid out in the main-line-adjacent region (second embodiment), the connection line between the circuit cell and the main line is short. Further, the connection line does not pass through other branch connection circuit cells or circuit cells subject to power control.

This holds true also when the individual connection circuit cell is laid out adjacent to the main line (third embodiment).

When the source current driving capability of the individual connection circuit cell is higher than that of the branch connection circuit cells (fourth embodiment), a source current flows in smaller amounts through the second branch line in proportion to this difference in driving capability. This holds true also for the other s (fifth embodiment defined by the maximum source current and sixth embodiment defined by the total transistor gate width). That is, the maximum source current of the individual connection circuit cell is greater than that of the branch connection circuit cells in the fifth embodiment. Therefore, a source current flows in smaller amounts through the second branch line in proportion to this difference in current. The total transistor gate width of the individual connection circuit cell is greater than that of the branch connection circuit cells in the sixth embodiment. Therefore, a source current flows in smaller amounts through the second branch line in proportion to this difference in gate width.

It should be noted that the term "gate width" here refers to the size of the gate orthogonal to the direction of channel current controlled by the gate. On the other hand, the term "total gate width" refers to the sum of the gate widths in each gate finger when the gate is formed with a plurality of units (gate fingers) connected in parallel with each other.

Embodiments of the present invention suppress uselessly thick wirings for the first and second branch lines in the circuit cells, thus permitting reduction in cell area and providing high efficiency in the layout of cells in the circuit block.

DETAILED DESCRIPTION OF THE PREFERRED EMBODIMENTS

The preferred embodiments of the present invention will be described below with reference to the accompanying drawings.

First Embodiment

Figure 1:
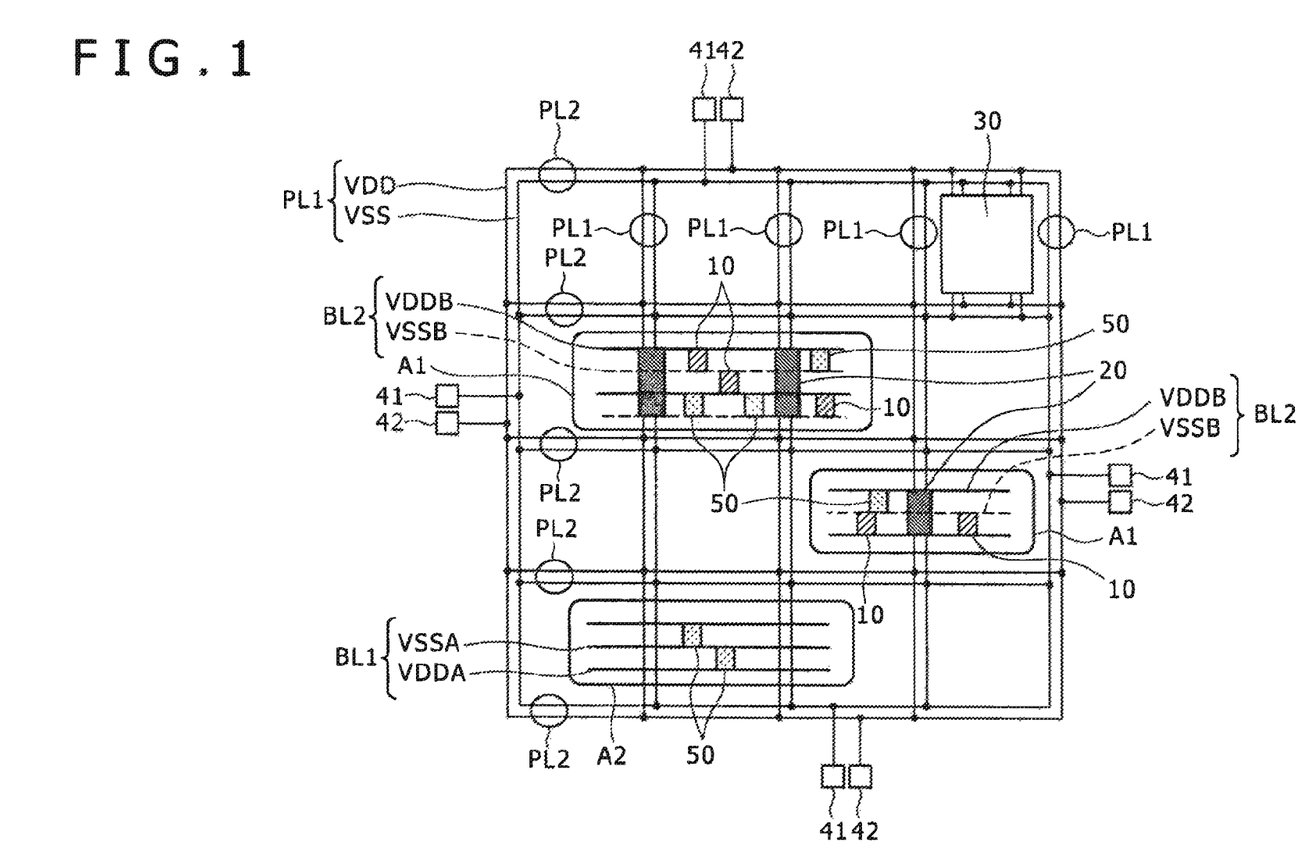
FIG. 1 is a diagram illustrating an example of the configuration of a semiconductor integrated circuit according to embodiments of the present invention.

FIG. 1 is a diagram illustrating an example of the configuration of a semiconductor integrated circuit according to embodiments of the present invention. FIG. 1 schematically shows wirings adapted to supply a source voltage Vdd or reference voltage (e.g., GND voltage) and circuit cells connected to these wirings.

The semiconductor integrated circuit shown in FIG. 1 includes cell layout regions A1 and A2 and circuit block 30. The cell layout region A1 is based on the MTCMOS technique. The cell layout region A2 is not based on the MTCMOS technique. The circuit block 30 is a type of non-MTCMOS-based circuit block designed by a scheme other than the cell layout scheme.

In the present embodiment, it is absolutely essential that the semiconductor integrated circuit have the cell layout region A1 based on the MTCMOS technique. On the other hand, the cell layout region A2 not based on the MTCMOS technique and the circuit block 30 may or may not be provided at will. It should be noted, however, that the circuits related to control such as control circuit and memory section may be designed separately as always-on circuit blocks which are always powered after the activation as with the circuit block 30. Further, part of the logic block and other regions designed based on the cell layout scheme may not be based on MTCMOS as in the case of the cell layout region A2. Such a region is always powered after the activation.

FIG. 1 illustrates an example in which the semiconductor integrated circuit includes the cell layout region A2 and circuit block 30 both of which are not based on the MTCMOS technique, in addition to the cell layout region A1 based on the MTCMOS technique.

In the example shown in FIG. 1, the semiconductor integrated circuit includes a plurality of power line pairs PL1 serving as "main lines," a plurality of power line pairs PL2, a plurality of branch line groups BL1 and a plurality of branch line groups BL2 serving as "branch lines."

The power line pairs PL1 are disposed parallel to each other so as to be arranged long in the column direction and spaced at predetermined intervals in the row direction.

The power line pairs PL2 are disposed parallel to each other so as to be arranged long in the row direction orthogonal to the power line pairs PL1 and spaced at predetermined intervals in the column direction.

In FIG. 1, the five power line pairs PL1 and five power line pairs PL2 intersect each other, thus forming a power line pattern in the form of a grating as a whole.

The power line pairs PL1 and PL2 each include a pair of a source voltage main line VDD and reference voltage main line VSS which are disposed parallel to each other. At the intersections in the power line pattern in a grating form, the source voltage main lines VDD are connected to each other, and the reference voltage main lines VSS are also connected to each other.

In the power line pattern in a grating form, power input cells 41 and 42 are connected to each of the power line pairs PL1 and PL2 on the four sides of the outer frame. The reference voltage main line VSS is connected to the power input cell 41, and the source voltage main line VDD to the input cell 42.

A reference voltage Vss is supplied from a source external to the semiconductor integrated circuit via the power input cell 41. A source voltage Vdd is supplied from a source external to the semiconductor integrated circuit via the power input cell 42.

The branch line groups BL1 and BL2 branch from the power line pairs PL1 serving as "main lines" to supply power, for example, to circuit cells 10 subject to power control. The same cells 10 are basic units of the semiconductor integrated circuit.

Further, the branch line groups BL1 and BL2 are formed to extend in the row direction from the power line pairs PL1 serving as "main lines" which are arranged long in the column direction.

Here, one of the major features of the semiconductor integrated circuit according to the present embodiment is that the same circuit includes "the circuit cells 10 subject to power control the supply and interruption of power to which is controlled by a power switch and always-on circuit cells 50 which are always powered after the activation" in the cell layout region A1.

In the example shown in FIG. 1, the power switches are formed as switch cells 20 in an underlying layer of the layout region of the power line pairs PL1, i.e., the region closer to the semiconductor substrate than the wirings of the power line pairs PL1. The power switches may be provided as appropriate in the circuit cells 10 subject to power control. In the present embodiment, the same cells 10 may be formed in such a manner. In the example shown in FIG. 1, however, the power switches are implemented as the power switch cells 20, and all the power switch cells 20 are laid out along the power line pairs PL1 and in the underlying layer thereof. This is done to ensure high efficiency in the layout of the power switch cells and facilitate the connection of control lines adapted to control the power switch cells.

In the cell layout region A1, the branch line groups BL2 each branch from the single power line pair PL1. The above-described two types of circuit cells, i.e., the circuit cells 10 subject to power control and always-on circuit cells 50, are connected to the branch line groups BL2.

Here, the branch line groups BL2 include a branch line applied with the source voltage Vdd (hereinafter referred to as the source voltage branch line VDDB) and another branch line applied with the reference voltage Vss (hereinafter referred to as the reference voltage branch line VSSB). The circuit cells 10 subject to power control and always-on circuit cells 50 are both connected to the source voltage branch line VDDB and reference voltage branch line VSSB so as to be supplied with power.

However, although not illustrated in detail in FIG. 1, one or both of the source and reference voltage branch lines VDDB and VSSB, connected to the circuit cells 10, are connected to the associated main line (source voltage main line VDD or reference voltage main line VSS) of the power line pair PL1 via the power switch cell 20. In contrast, both of the source and reference voltage branch lines VDDB and VSSB, connected to the always-on circuit cells 50, are connected to the associated main line (source voltage main line VDD or reference voltage main line VSS) of the power line pair PL1 directly without the power switch cell 20.

In FIG. 1, the reference voltage branch lines VSSB (or source voltage branch lines VDDB) are shown to be configured in the same manner irrespective of whether they are connected to the main line via the power switch cell 20.

Here, as is well known, there are three types of MTCMOS control, namely, a type of control adapted to control the source potential Vdd side with the power switch (so-called header type), another type of control adapted to control the reference potential Vss side with the power switch (so-called footer type), and still another type of control adapted to perform the two types of control. In the present embodiment, any of the three types of control may be used. It should be noted, however, that the type designed to control both the header and footer types with the power switch leads to a large area overhead. Therefore, the header or footer type is preferred.

The power switch cells 20 receive a control signal not illustrated in FIG. 1 and can interrupt at least one of the source voltage Vdd and reference voltage Vss in the power line pair PL1 and branch line groups BL2 according to the received control signal. For example, each of the power switch cells 20 includes a power switch transistor. The same cell 20 turns off the same transistor according to the logic of the received control signal, thus interrupting the source current path to the circuit cell 10 subject to power control connected to the branch line group BL2.

In the case of a semiconductor integrated circuit based on MTCMOS power interruption technique, an MOS transistor having a higher threshold voltage than the transistor of the same conductivity type in the circuit cell 10 subject to power control is used as the power switch transistor. For example, in the case of the footer type adapted to electrically disconnect the reference voltage branch line VSSB from the reference voltage main line VSS according to the control signal, an NMOS transistor having a high threshold voltage is used as the power switch transistor. In the case of the header type adapted to electrically disconnect the source voltage branch line VDDB from the source voltage main line VDD according to the control signal, a PMOS transistor having a high threshold voltage is used as the power switch transistor.

On the other hand, the power switch cells 20 are not provided in the cell layout region A2. In the same region A2, the branch line group BL1 including a source voltage branch line VDDA and reference voltage branch line VSSA branches from the power line pair PL1. The source voltage branch line VDDA is connected to the source voltage main line VDD via a contact, and the reference voltage branch line VSSA to the reference voltage main line VSS via a contact.

In contrast, the branch line group BL2 in the cell layout region A1 includes the source and reference voltage branch lines VDDB and VSSB as described above. The source and reference voltage branch lines VDDB and VSSB are connected respectively to the source and reference voltage main lines VDD and VSS directly (via contacts) or via the power switch cell 20.

As described above, the branch line groups BL1 and BL2 differ from each other in the presence or absence of the power switch cell 20 inserted. That is, the power switch cell 20 may be inserted between the branch line group BL2 and power line pair PL1. However, the power switch cell 20 is not inserted between the branch line group BL1 and power line pair PL1.

It should be noted that those circuits which need not be cut off from the power line, for example, because of their constant operation, are supplied with power directly from a power line pair without any branch line group as with the circuit block 30 shown in FIG. 1.

In the present embodiment, it is absolutely essential that the main lines (e.g., power line pair PL1) and branch lines (e.g., branch line group BL2) be disposed in the cell layout region A1. It is also absolutely essential that the cell layout region A1 have the power switch cell 20 or a power switch function in other form.

A description will be given below of more detailed embodiments based on the first embodiment taking, as an example, the footer type power control.

Second Embodiment

Figure 2:
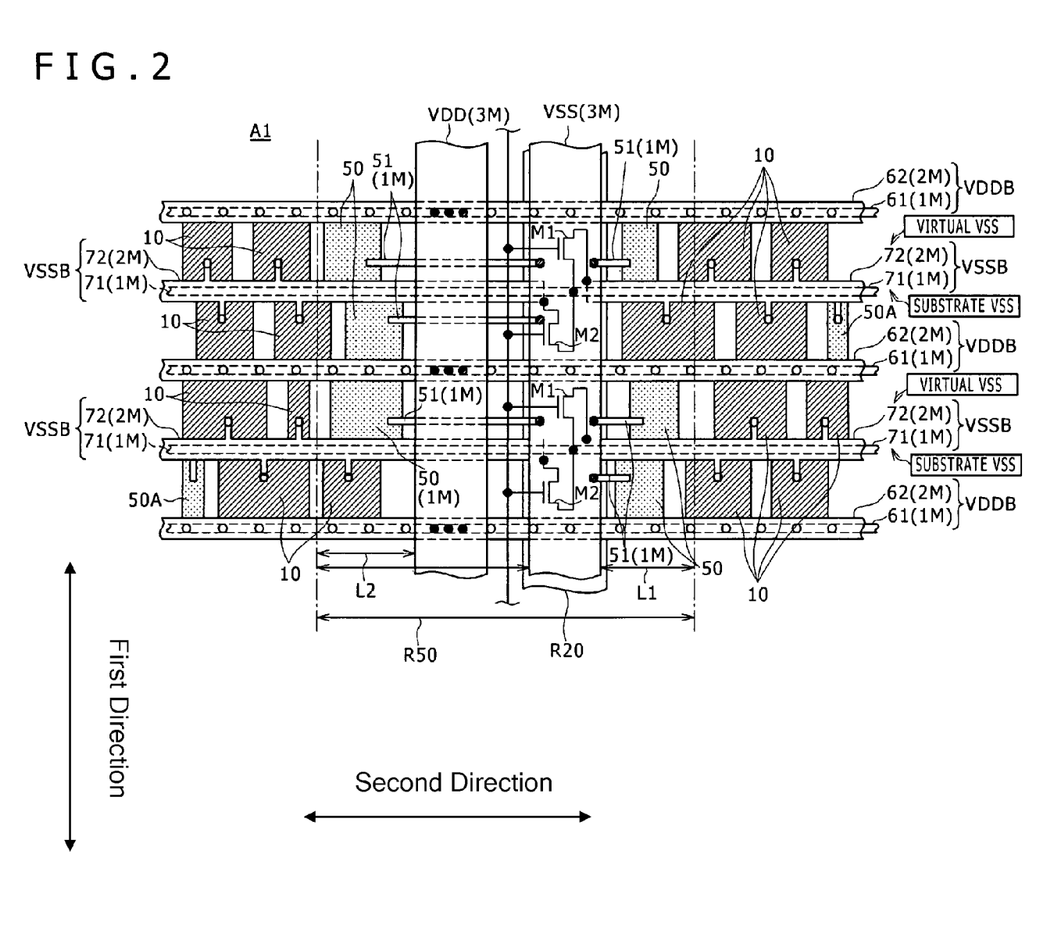
FIG. 2 is a schematic plan view according to the embodiments of the present invention illustrating a configuration example of a cell layout region shown in FIG. 1.

FIG. 2 is a schematic plan view illustrating a configuration example of the cell layout region A1 shown in FIG. 1.

In the cell layout region A1 illustrated in FIG. 2, the source and reference voltage main lines VDD and VSS, formed, for example, with a third wiring layer (3M), run parallel to each other in the column direction (vertical direction in FIG. 2).

The source voltage branch lines VDDB, originating from the source voltage main line VDD, are laid out to extend orthogonal to the source voltage main line VDD.

The source voltage branch lines VDDB each have a two-layer structure which includes a VDD underlying branch line 61 made up of a first wiring layer (1M) and a VDD overlying branch line 62 made up of a second wiring layer (2M). The VDD underlying branch line 61 is connected to unshown wells if the wells must be fixed at the source voltage Vdd. Normally, N-type wells (N wells) are electrically fixed at the source voltage Vdd. A high-concentration N-type diffusion region (contact region) is normally formed in the N well. The VDD underlying branch line 61 is connected to the N-type contact region by means of first contacts (1C). These contacts are omitted in FIG. 2. The VDD overlying branch line 62 is formed wider than the VDD underlying branch line 61 and overlies the same line 62. The VDD overlying and underlying branch lines 62 and 61 are electrically connected together by contacts. These contacts are shown to be white unfilled squares provided between the first and second wiring layers (1M) and (2M), i.e., second contacts (2CH). The second contacts are provided, for example, equidistantly or at regular intervals.

The reference voltage branch lines VSSB, originating from the reference voltage main line VSS, are laid out to extend orthogonal to the reference voltage main line VSS.

The reference voltage branch lines VSSB each have a two-layer structure which includes a VSS underlying branch line 71 made up of the first wiring layer (1M) and a VSS overlying branch line 72 made up of the second wiring layer (2M). The VSS underlying branch line 71 is connected to unshown wells (or substrate) if the wells (or substrate) must be fixed at the reference voltage Vss. Normally, P-type wells (P wells) (or substrate) are fixed at the reference voltage Vss. A high-concentration P-type diffusion region (contact region) is formed in the P wells (or substrate). The VSS underlying branch line 71 is connected to the P-type contact region by means of the first contacts (1C). These contacts are omitted in FIG. 2.

On the other hand, the VSS overlying branch line 72 is formed wider than the VSS underlying branch line 71 and disposed in the overlying layer of the same line 71 along the same line 71. It should be noted, however, that the VSS overlying branch line 72 is not connected to the VSS underlying branch line 71 by the second contacts (2CH).

The VSS overlying branch line 72 is connected to the circuit cells 10 adjacent to the region of the same line 72 via the second contacts (2CH), further underlying layer and so on.

The VSS underlying branch line 71 intersects a layer underlying the reference voltage main line VSS (3M) (line 71 is not horizontally divided in FIG. 2). In contrast, the VSS overlying branch line 72, which extends downward of the reference voltage main line VSS, may be divided on both sides of the reference voltage main line VSS. This configuration is used when the two portions on both sides of the reference voltage main line VSS must be controlled by different power switches.

Going into more detail, a layout region of the power switch cells 20 (R20) is provided in the underlying region of the VSS underlying branch line 71. The VSS overlying branch line 72 is divided into two segments in the underlying region of the reference voltage main line VSS. The two segments extend in two directions orthogonal to the reference voltage main line VSS. The connection of these two segments of the VSS overlying branch line 72 to the common VSS underlying branch line 71 is controlled by different power switches M1 and M2. Although shown to be a single control line in FIG. 2, the power switches M1 and M2 are controlled by different control lines if they are controlled separately.

As described above, the VSS overlying branch line 72 is controlled by the power switches M1 and M2. Therefore, the same line 72 functions as a so-called virtual VSS line.

The VSS overlying branch line 72 is not supplied with the reference potential Vss when the power switch is off. This causes the source nodes of the circuit cells 10 connected to the VSS overlying branch line 72 to electrically float. At power shutdown, the source nodes rise in potential because of leak current of the transistors in the circuit cells 10.

Then, when the power switch turns on, the VSS overlying branch line 72 is connected to the reference voltage main line VSS. This discharges the charge accumulated by the leak current from the VSS overlying branch line 72.

As described above, in order for the VSS overlying branch line 72 to function as a virtual VSS line, the same line 72 is not connected to the VSS underlying branch line 71 via contacts, which is not the case of the source voltage branch lines VDDB.

The VSS overlying branch line 72 connected to the main line (reference voltage main line VSS) via a power switch is an example of the "first branch line." The VSS underlying branch line 71 connected directly (via contacts) to the main line without any power switch is an example of the "second branch line."

In the present embodiment, a main-line-adjacent region (R50) is defined which is a region within a predetermined distance from the reference voltage main line VSS. For the main-line-adjacent region (R50), a distance L1 from the reference voltage main line VSS and a distance L2 from the source voltage main line VDD need only be equal or in a predetermined ratio. Alternatively, for the main-line-adjacent region (R50), the one distance L1 from the reference voltage main line VSS and another distance L3 from the same line VSS need only be constant. It should be noted that the distances L1 and L3 may be the same or different from each other.

In the present embodiment, the always-on circuit cells 50 shown in FIG. 1 are laid out in the main-line-adjacent region (R50) defined as described above.

Normally, there are always-on circuit cells 50A which are closely related to the peripheral circuit cells 10. Therefore, their layout positions are determined based on the relationship with the same cells 10 although this also depends upon what kind of function the circuit cells, included in the always-on circuit cells 50, have. The always-on circuit cells 50A are a type of the circuit cells 50 as far as the application in FIG. 1 is concerned.

In the present embodiment, the always-on circuit cells 50 other than the circuit cells 50A are laid out in the main-line-adjacent region (R50). It should be noted, however, that there may not be any circuit cells like the always-on circuit cells 50A whose layout positions are determined based on the relationship with the peripheral circuit cells 10. In this case, all the always-on circuit cells are laid out in the main-line-adjacent region (R50).

It should be noted, however, that there may or may not be the circuit cells 10 subject to power control in the main-line-adjacent region (R50). FIG. 2 illustrates a case in which there are the circuit cells 10 subject to power control in part of the main-line-adjacent region (R50). In the absence of the circuit cells 10, the main-line-adjacent region (R50) is used exclusively for the always-on circuit cells 50.

The always-on circuit cells 50A laid out in a region other than the main-line-adjacent region (R50) have their source nodes connected to the reference voltage main line VSS via the VSS underlying branch line 71 (second branch line) of the reference voltage branch line VSSB. Therefore, the always-on circuit cells 50A are also referred to as the "branch connection circuit cells."

In contrast, the always-on circuit cells 50 laid out in the main-line-adjacent region (R50) have their source nodes connected to an individual connection line 51 made up, for example, of the first wiring layer (1M).

The individual connection line 51 is provided for each of the always-on circuit cells 50. The always-on circuit cells 50 are each connected to the main line (reference voltage main line VSS) by the individual connection line 51 particularly without the VSS underlying branch line 71 (second branch line) of the reference voltage branch line VSSB. Therefore, the always-on circuit cells 50 are also referred to as the "individual connection circuit cells."

Third Embodiment

In the present embodiment, a description will be given of a specific example (more detailed embodiment) for distinction between the always-on circuit cells 50 laid out in the main-line-adjacent region (R50) and the always-on circuit cells 50A laid out in a region other than the main-line-adjacent region (R50) based on the above first and second embodiments.

The circuit cells 50 and 50A can be distinguished from each other by the difference in source current driving capability. The difference in source current driving capability can be occasionally interpreted as the difference in maximum source current level from a different perspective. Alternatively, the total transistor gate width can be used as a specific measure proportional to the driving capability.

In the present embodiment, a determination is made as to whether a circuit cell is used as an individual connection circuit cell (circuit cell 50) laid out in the main-line-adjacent region (R50) and connected to the main line by the individual connection line 51 or as a branch connection circuit cell (circuit cell 50A) laid out in a region other than the main-line-adjacent region (R50) and connected to the main line via the second branch line (VSS underlying branch line 71). This determination is made based on any one of the driving capability, maximum source current level and total gate width or a combination thereof.

Going into more detail, when the driving capability is used as a measure, a circuit cell can be, for example, defined as an individual connection circuit cell (circuit cell 50) if the cell has a source current driving capability equal to or higher than a predetermined level, and as a branch connection circuit cell (circuit cell 50A) if the cell has a source current driving capability lower than the predetermined level.

When the maximum source current level is used as a measure, a circuit cell can be, for example, defined as an individual connection circuit cell (circuit cell 50) if the maximum source current level flowing through the cell is equal to or greater than a predetermined level, and as a branch connection circuit cell (circuit cell 50A) if the maximum source current level flowing through the cell is smaller than the predetermined level.

When the total gate width is used as a measure, a circuit cell can be, for example, defined as an individual connection circuit cell (circuit cell 50) if the total gate width is equal to or greater than a given width, and as a branch connection circuit cell (circuit cell 50A) if the total gate width is smaller than the given width.

Here, the term "gate width" refers to the gate size orthogonal to the channel current flow controlled by the gate. Further, the term "total gate width" refers to the sum of the gate widths in each gate finger when the gate is formed with a plurality of units (gate fingers) connected in parallel with each other.

Alternatively, the always-on circuit cell 50A laid out in a region other than the main-line-adjacent region (R50) may be defined based on its function so that the always-on circuit cells other than the cell 50A are laid out in the main-line-adjacent region (R50).

The always-on circuit cell 50A may include at least either an unknown propagation prevention circuit cell or retention register circuit cell.

An unknown propagation prevention circuit cell is normally connected between the circuit cell 10 and other circuit cell (e.g., other always-on circuit cell). If the circuit cell 10 is cut off from the power, the output thereof is unknown depending on its control timing. That is, whether the output of the circuit cell 10 takes on the value of 1 or 0 may vary depending on the power shutdown timing. In such a case, if the output stage of the circuit cell 10 subject to power control is an always-on circuit, the input changes depending on the power control timing. This leads to an unstable operation. To resolve such a problem, an unknown propagation prevention circuit cell is provided between the circuit cell 10 and other circuit cell.

Although being an always-on circuit cell, the unknown propagation prevention circuit cell is often implemented with a simple logic cell such as AND cell or OR cell to ensure that the logic level is fixed to 1 or 0. This cell belongs to a type of always-on circuit cell which does not consume much source current in all respects, i.e., current driving capability, maximum source current level and total gate width. Therefore, the unknown propagation prevention circuit cell should be laid out as a branch connection circuit cell (circuit cell 50A).

A retention register circuit cell is designed to retain the input or output of the circuit cell 10 subject to power control at power shutdown. The retention register circuit cell requires a minimum number of circuit cells needed to store data. This portion can be implemented with several inverters.

The always-on portion included in the retention register circuit cell belongs to a type of always-on circuit cell which does not consume much source current in all respects, i.e., current driving capability, maximum source current level and total gate width. Therefore, the always-on portion of the retention register circuit cell should be laid out as a branch connection circuit cell (circuit cell 50A).

Other than the above, a small-scale circuit which is an always-on circuit cell to be laid out in proximity to the circuit cell 10 subject to power control and which does not consume much source current should be laid out as a branch connection circuit cell (circuit cell 50A).

It should be noted that the concept of "basic driving capability" may be used as a measure of magnitude of the driving capability. Here, the basic driving capability is defined to be "1" when inverters, each made up of a pair of PMOS and NMOS transistors, are formed at a given pattern height with the largest possible gate width by the predetermined manufacturing process. The term "pattern height" refers to the cell size in the column direction or along the length of the reference voltage main line VSS in FIG. 2. This definition allows for classification of the driving capabilities of almost all of the logic circuits by a multiple of the basic driving capability. Therefore, a circuit cell may be defined as an individual connection circuit cell if its multiple of the basic driving capability is equal to or higher than a certain multiple, and as a branch connection circuit cell if its multiple of the basic driving capability is smaller than the certain multiple.

In consideration of best effectiveness, circuit cells should be laid out adjacent to a power main line because IR drop can be minimized during normal operation. Therefore, fixed information, namely, "laid out adjacent to a power main line" may be given rather than "laid out within a predetermined distance." That is, an individual connection circuit cell (always-on circuit cell 50) is laid out adjacent to a main line without the circuit cell 10 subject to power control provided therebetween. At this time, other circuit cell is allowed to be laid out between the branch connection circuit cell (always-on circuit cell 50A) and main line.

On the other hand, some designers may translate the above measures (range of the main-line-adjacent region (R50), driving capability, maximum current level, total gate width, and presence or absence of circuit cells laid out adjacent to a main line) so as to make a determination based on the IR drop tolerance during normal operation and reference EM (electromigration) resistance. This contributes to building an automatic MTCMOS layout tool based on the present design method, thus allowing for automatic layout of always-on circuit cells with no need for designer judgment.

The above first to third embodiments provide the following benefits.

That is, these embodiments ensure reduced source current flowing through the reference voltage branch lines VSSB and particularly the VSS underlying branch line 71. The source current is reduced in proportion to the number of always-on circuit cells 50 used as individual connection circuits. In the case of the example shown in FIG. 2, therefore, there is a sufficient margin for IR drop and EM resistance even if the widths of the reference voltage branch lines VSSB, and particularly those of the VSS underlying branch lines 71, are reduced. As a result, the operating reliability will not diminish even if the widths of the reference voltage branch lines VSSB are reduced as a result of reduction in width of the VSS underlying branch lines 71 and VSS overlying branch lines 72. This makes it possible to reduce the size of each circuit cell in proportion to the reduction in width of the branch lines. Although the size of each cell is reduced by a small factor, tens of thousands of cells can be downsized in an across-the-board manner. This provides a significant reduction in size of the semiconductor integrated circuit as a whole. The embodiment of the present invention contributes to a considerably suppressed increase in area resulting from the application of MTCMOS and other power control technique.

Further, the always-on circuit cells 50 to be connected to a main line by the individual connection line 51 are brought as close to the main line as possible. This prevents the individual connection line 51 from interfering with the layout and disposition of other circuit cells. If the always-on circuit cells 50 to be connected to a main line by the individual connection line 51 are laid out in a non-orderly manner (in a manner in which their layout region is not determined), the same line 51 may interfere with the layout and disposition of other circuit cells. This may lead to expense in time and effort, increased number of wirings or increased cell area. In the present embodiment, the always-on circuit cells 50 are laid out close to the main line by the individual connection line 51, thus providing the above-described benefits without any of the problems given above.

In the first to third embodiments, the parameters were described for distinguishing between the always-on circuit cells 50 and 50A and defining the layout regions. Making these parameters into rules contributes to automated layout design of an MTCMOS block containing these different types of always-on circuit cells.

The present application contains subject matter related to that disclosed in Japanese Priority Patent Application JP 2008-154475 filed in the Japan Patent Office on Jun. 12, 2008, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:
1. A semiconductor integrated circuit comprising:
a main line in a main-line-adjacent region, the main line extending along a first direction;
a first circuit in a first region, the main-line-adjacent region is between the first region and a second region;
a second circuit electrically connected to the main line, the second circuit is in the main-line-adjacent region;
a first branch line electrically connected to the main line, the first branch line extending along a second direction;
a second branch line electrically connected to the first circuit, the second branch line extending along the second direction; and
a power switch in the main-line-adjacent region, the power switch is controllable to provide electrical connection and disconnection between the first branch line and the second branch line, wherein the main line is in a main line wiring layer and the first branch line is in a branch line wiring layer, the branch line wiring layer is between the main line wiring layer and a circuit layer.

2. The semiconductor integrated circuit according to claim 1, wherein the second circuit is directly electrically connected to the main line.

3. The semiconductor integrated circuit according to claim 1, wherein the first direction differs from the second direction.

4. The semiconductor integrated circuit according to claim 1, further comprising:
   a contact that electrically connects the first branch line to the main line.

5. The semiconductor integrated circuit according to claim 1, further comprising:
   wiring that electrically connects the second branch line to the first circuit.

6. The semiconductor integrated circuit according to claim 1, further comprising:
   a third circuit electrically connected to the second branch line.

7. The semiconductor integrated circuit according to claim 6, wherein the third circuit is in the second region.

8. The semiconductor integrated circuit according to claim 1, wherein the first circuit is in the circuit layer.

9. The semiconductor integrated circuit according to claim 1, wherein the second circuit is in the circuit layer.

* * * * *